United States Patent
Mori et al.

(10) Patent No.: US 7,384,487 B2
(45) Date of Patent: Jun. 10, 2008

(54) METHOD FOR PRODUCING MAGNETOSTRICTIVE ELEMENT AND CONTAINER FOR SINTERING

(75) Inventors: Teruo Mori, Tokyo (JP); Junichi Takahashi, Tokyo (JP)

(73) Assignee: TDK Corporation, Tokyo (JP)

( * ) Notice: Subject to any disclaimer, the term of this patent is extended or adjusted under 35 U.S.C. 154(b) by 358 days.

(21) Appl. No.: 11/350,215

(22) Filed: Feb. 8, 2006

(65) Prior Publication Data

US 2006/0174976 A1     Aug. 10, 2006

(30) Foreign Application Priority Data

Feb. 10, 2005   (JP)   ............................. 2005-034178
Mar. 23, 2005   (JP)   ............................. 2005-083129

(51) Int. Cl.
*H01F 1/053*   (2006.01)
*H01F 1/08*    (2006.01)
(52) U.S. Cl. ........................................ 148/103; 419/56
(58) Field of Classification Search ............... None
See application file for complete search history.

(56) References Cited

U.S. PATENT DOCUMENTS

| | | | |
|---|---|---|---|
| 3,949,351 A | 4/1976 | Clark et al. | |
| 4,152,178 A | 5/1979 | Malekzadeh et al. | |
| 4,308,474 A | 12/1981 | Savage et al. | |
| 4,375,372 A | 3/1983 | Koon et al. | |
| 6,696,015 B2* | 2/2004 | Tokuhara et al. | 419/57 |
| 2002/0006347 A1* | 1/2002 | Tokuhara et al. | 419/38 |
| 2002/0159909 A1* | 10/2002 | Oota et al. | 419/29 |
| 2002/0197180 A1* | 12/2002 | Tokuhara et al. | 419/57 |
| 2003/0178103 A1* | 9/2003 | Harimoto et al. | 148/105 |
| 2005/0061401 A1* | 3/2005 | Tokoro et al. | 148/103 |
| 2005/0142022 A1* | 6/2005 | Mori et al. | 419/38 |
| 2005/0173025 A1* | 8/2005 | Iwasaki et al. | 148/103 |

\* cited by examiner

*Primary Examiner*—John P. Sheehan
(74) *Attorney, Agent, or Firm*—Hogan & Hartson LLP (57) ABSTRACT

It is an object of the present invention to provide a method for producing a magnetostrictive element, capable of assuredly producing a magnetostrictive element by powder metallurgy. In a container for sintering 10, a compact 100 is sintered into a magnetostrictive element having a composition of $SmFe_2$ while held by a support 20 of $SmFe_2$ or Nb stable during the sintering step. The support 20 is composed of particles coming into contact with the compact 100 at multiple points, to control fusion-bonding between the support 20 and the compact 100 to a limited extent.

8 Claims, 6 Drawing Sheets

Comparative Example 5

FIG. 4B

Comparative Example 6

FIG. 5A

Example 1

FIG. 5B

Example 2

FIG. 6

METHOD FOR PRODUCING MAGNETOSTRICTIVE ELEMENT AND CONTAINER FOR SINTERING

BACKGROUND OF THE INVENTION

1. Field of the Invention

The present invention relates to a method for producing a magnetostrictive element and a magnetostrictive element, more particularly a method for producing a magnetostrictive element which contains Sm and a transition metal element.

2. Description of the Related Art

Magnetostriction is a phenomenon of a ferromagnetic material to undergo a dimensional change when magnetized, and a magnetostrictive material is a material which exhibits this phenomenon. Saturation magnetostrictive constant, which represents a dimensional change at saturation by magnetostriction, is generally in a range from $10^{-5}$ to $10^{-6}$, and a magnetostrictive material having a high saturation magnetostrictive constant is sometimes referred to as a giant-magnetostrictive material. These materials are widely used for vibrators, filters, sensors, and the like.

At present, a magnetostrictive material based on a laves type intermetallic compound of $RFe_2$, which is a compound of R (rare-earth element) and Fe, is known to have a high saturation magnetostrictive constant (refer to U.S. Pat. Nos. 3,949,351, 4,152,178, 4,308,474 and 4,375,372). These materials, however, involve problems of insufficient magnetostrictive value in an external magnetic field of low intensity, although exhibiting a high value when applied to a magnetic field of high intensity. Therefore, magnetostrictive materials based on a laves type intermetallic compound of $RFe_2$ have been studied to have a higher magnetostrictive value even in an external magnetic field of low intensity, and it is proposed to orient the material along the [111] axis as an easy-magnetization axis of high magnetostrictive constant. Magnetostrictive materials based on a laves type intermetallic compound of $RFe_2$ exhibit a high magnetostrictive value at a composition of $Tb_{0.3}Dy_{0.7}Fe_{2.0}$ (atomic ratio), and this composition has been used exclusively.

SUMMARY OF THE INVENTION

A Sm—Fe-based material is one of the materials which exhibit a high magnetostrictive value at normal temperature, like $Tb_{0.3}Dy_{0.7}Fe_{2.0}$.

The present inventors, who have studied production of a Sm—Fe-based magnetostrictive element for its advantages in material cost, have given attention to powder metallurgy. At present, however, no Sm—Fe-based magnetostrictive element has been produced on a commercial scale by powder metallurgy. It is therefore necessary to determine detailed optimum conditions for the production steps, e.g., compacting in a magnetic field and sintering.

The present invention has been developed to solve these technical problems. It is an object of the present invention to provide a method for producing a magnetostrictive element which can assuredly produce a magnetostrictive element by powder metallurgy. It is another object to provide a container for sintering.

The present inventors have extensively studied the optimum conditions for producing a magnetostrictive element by powder metallurgy using a Sm—Fe-based material, to achieve the above objects. The present invention is based on the study results on the sintering step, more particularly a container for sintering which holds an object to be sintered into a magnetostrictive element during the sintering, among those items studied.

The powder metallurgy process adopted for the present invention compacts an alloy powder of a given composition into a compact in a magnetic field and sinters the compact in an inert gas atmosphere to produce a magnetostrictive element.

A compact tends to be oxidized or to show deterioration, e.g., discoloration, caused by radiation heat generated by a heater as a heat source for sintering, during the sintering step, and hence is protected by a container. For example, referring to FIG. 6, the compacts 1 are held by the container 2 for sintering. In the container 2, there is provided with the setter 3, which supports the rod-shaped compacts 1 during the sintering.

Figure 6:
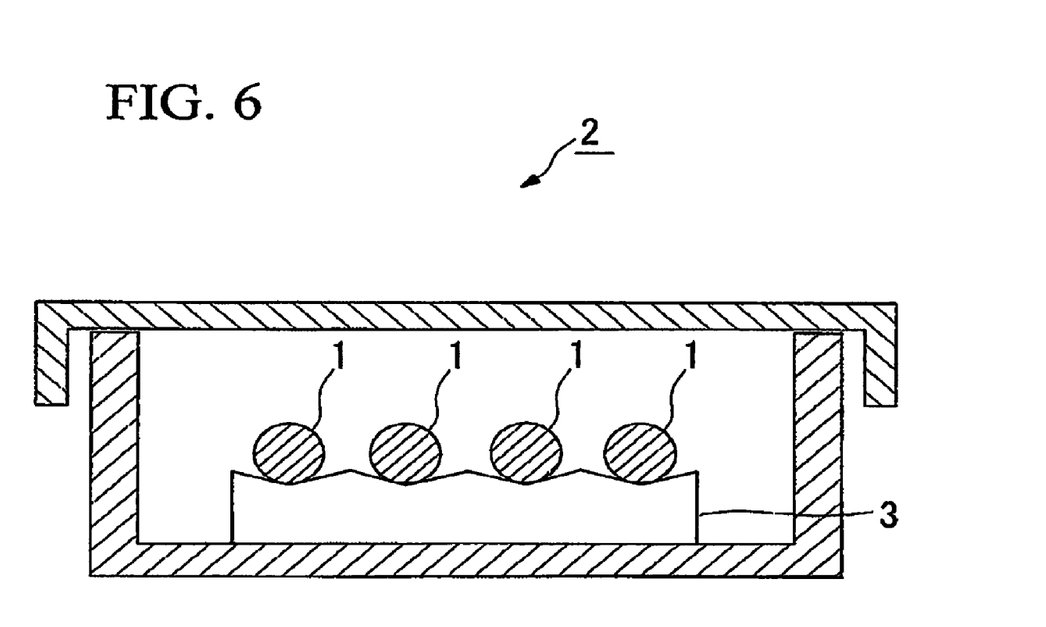
FIG. 6 is a cross-sectional view illustrating a conventional container for sintering.

When a magnetostrictive element is produced by a conventional procedure using a material of $Tb_{0.3}Dy_{0.7}Fe_{2.0}$, the compact 1 is highly reactive to react with the setter 3, depending on a setter material, to form a reaction product in the interface between them. The reaction product, when formed, may strain the compact 1 by a mechanical stress generated while the compact 1 is sintered to contract, which causes uneaven spacing of lattice planes in the compact 1, thereby magnetic properties of the compact 1 (or magnetictrictive element) are deteriorated. Therefore, the setter 3 is made of $Dy_2O_3$ or the like, for example, to prevent formation of such a reaction product on the compact 1.

The present inventors have attempted to sinter a compact with the setter 3 of $Dy_2O_3$, also when a magnetostrictive element is produced by using $SmFe_2$ as one of Sm—Fe-based materials, to confirm that Sm is oxidized to change $SmFe_2$ into $SmFe_3$ to greatly deteriorate its magnetostrictive value.

They have also studied various other materials to find that the above problems are prevented only when Nb or $SmFe_2$ as the same material as that for the compact are used, although most of the other materials studied cause problems, e.g., oxidation of Sm as is the case with $Dy_2O_3$ to deteriorate magnetic properties or fusion-bonding between the compact (or sintered body) and setter after the sintering step is over.

The method of the present invention, developed based on these study results, is for producing a magnetostrictive element having a composition of $SmFe_2$, comprising steps of compacting a starting powder into a compact in a magnetic field and of sintering the compact while being supported by a support of Nb and/or $SmFe_2$ in a container.

Use of a support of Nb and/or $SmFe_2$ for supporting a compact during the sintering step can prevent oxidation of the compact and control fusion-bonding between the compact and the support to a limited extent.

The present inventors also have found that a plate-shaped setter, which has been conventionally used, tends to fusion-bond in the interface with a compact because of a large contact area between them, and that the fusion-bonding is controlled to a lesser extent with a setter having a smaller contact area.

It is therefore preferable that a support comes into contact with a compact at multiple points. This further reduces extent of the fusion-bonding. The contact area between them is preferably as small as possible for the present invention to reduce extent of the fusion-bonding, although a structure of line contact between them is not ruled out.

For a compact to be supported at multiple points, it is preferably placed on a number of Nb and/or $SmFe_2$ particles in a container. It can be also held at a fixed position in the container by these particles.

The present invention allows a mixture of Nb and SmFe$_2$ particles to be used for the support. Alternately, a compact maybe be supported by a number of projections or the like provided on a plate-shaped base board of Nb and/or SmFe$_2$ to secure multiple point contact.

The present invention also provides a container for sintering which is used to hold an object to be sintered into a magnetostrictive element having a composition of SmFe$_2$ during the sintering. The container comprises a partly opened container body, a lid for covering the opening of the container body and an inclusion of Nb and/or SmFe$_2$ which lies in the container body between the container body and the object to be sintered.

The object to be sintered is prevented from being oxidized during the sintering step, when supported by the inclusion.

The inclusion is preferably in the form of particles having a size of 0.1 to 2.0 mm.

The method of the present invention can prevent oxidation or the like during the sintering step by selecting an optimum material for the setter, and thereby to prevent deterioration of magnetostrictive element characteristics caused by the setter material and fusion-bonding of the compact with the setter. Thus, the conditions under which a magnetostrictive element is assuredly and well sintered have been established.

BRIEF DESCRIPTION OF THE DRAWINGS

FIG. 4 presents photographs each illustrating a sintered body structure.

FIG. 5 presents photographs each illustrating a sintered body structure.

DETAILED DESCRIPTION OF THE PREFERRED EMBODIMENTS

The present invention is described by the embodiments shown below.

The present invention uses a magnetostrictive material containing Sm and a transition metal element to produce an an isotropic giant-magnetostrictive material by powder metallurgy. In the above magnetostrictive material, Sm may be partly substituted by at least one element selected from the group consisting of Y, Nd and Tb.

A transition metal element T is at least one element preferably selected from the group consisting of Fe, Ni and Co, of which Fe is particularly preferable. A preferable magnetostrictive material is based on SmFe, accordingly. A transition metal element T may be partly substituted by at least one element M selected from the group consisting of Mo, W, Cr, Nb, Ta, Ti, V, Ru, Rh, Pt, Ag, Gd and B.

Moreover, a SmFe-based magnetostrictive material preferably has a SmFe$_2$ phase.

Such a magnetostrictive material can be produced by a process comprising a crushing, compacting in a magnetic field and sintering steps.

A starting material of final composition may be directly used, after being crushed. The embodiment of the present invention, however, adopts a characteristic method for producing a giant-magnetostrictive material in which a mixed starting powder comprising different compositions is used.

More specifically, 2 or more compositions of different melting point are used for the starting powder. In the embodiment, the mixed starting powder comprises a material for the main phase (hereinafter arbitrarily referred to as main phase material) and another material (hereinafter arbitrarily referred to as grain boundary phase material) having a lower melting point than the main phase material. When the mixed starting powder is sintered, the grain boundary phase material melts in advance of the main phase material to form the liquid phase. This can accelerate the sintering process to have a higher sintered body density. One of the preferable mixed powder compositions which satisfy the above conditions comprises a SmFe$_{1.96}$ alloy (melting point: 900° C.) as the main phase material and Sm$_{1.77}$Fe alloy (melting point: 720° C.) as the grain boundary phase material.

The alloy powder of the main phase material is preferably single-crystalline, because of improved crystal orientation expected.

The mixing ratio of the main phase material to the grain boundary phase material maybe set arbitrarily, but preferably according to the following relationship.

The content "a" (% by weight) of the main phase material is preferably in a range of 70<a<100, more preferably 80<a<95. When it is excessively low, i.e., ratio of the main phase material to be oriented in a magnetic field is excessively low, degree of orientation after sintering may be insufficient. When it is excessively high, on the other hand, by which is meant that the main phase material composition is close to the final composition, it signifies little to use a grain boundary phase material for improved sintered body density.

The magnetostrictive material produced by weighing and mixing the main phase material and grain boundary phase material may be then crushed. In the crushing step, a crushing machine may be adequately selected from a wet ball mill, attritor, atomizer and the like. Of these machines, an atomizer is particularly preferable, because it can apply an impact and shear stress simultaneously to the particles to prevent their agglomeration and hence enhance productivity. The crushing is preferably conducted in a non-oxidative atmosphere, e.g., in an inert gas atmosphere of Ar gas or the like, or under vacuum. The mean particle size after crushing is 5 to 20 μm, preferably 10 to 20 μm. When it is excessively small, the particles tend to be oxidized in the production process to deteriorate the magnetostrictive characteristics. When it is excessively large, on the other hand, the sintered body will have an insufficient density and a number of open pores, because of insufficient sintering rate.

The mixed magnetostrictive material is compacted into a desired shape before being sintered.

In the case of producing a giant-magnetostrictive material having an isotropy, the compacting is carried out in a magnetic field to principally orient the main phase material particles in one direction to orient the sintered magnetostrictive material along the [111] axis. Magnetic Field intensity to be applied is 480 to 1760 kA/m, preferably 960 to 1760 kA/m. Magnetic field direction may be perpendicular to or in parallel to pressure direction. Compacting pressure is $50 \times 10^6$ Pa or more, preferably $300 \times 10^6$ Pa or more.

The compact prepared by the compacting is sintered, while it is being held by a container for sintering.

Figure 1:
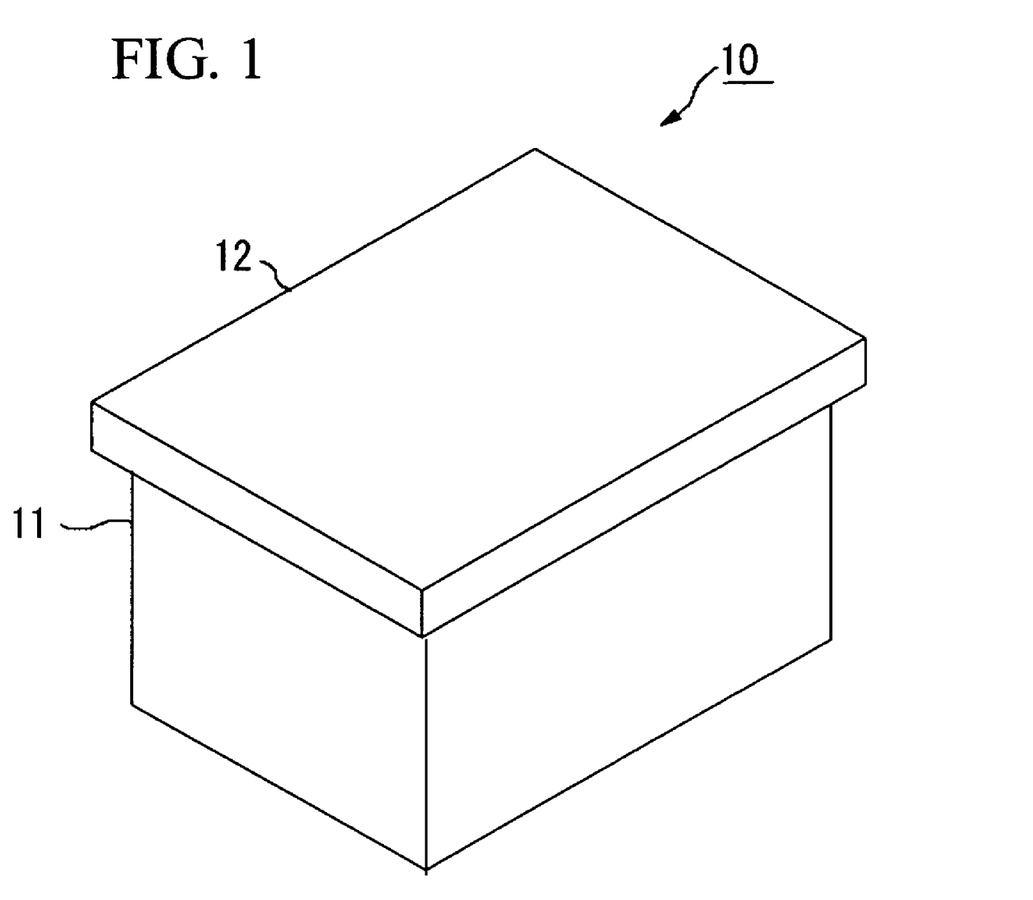
FIG. 1 is a perspective view illustrating an exterior appearance of a container for sintering according to the present embodiment.

The container for sintering 10, illustrated in FIG. 1, comprises the container body 11 and lid 12. It is preferable that the container body 11 and lid 12 are made of Mo or the like.

A plurality of the compacts (objects to be sintered) 100 are sintered while being held by the container 10.

Figure 2:
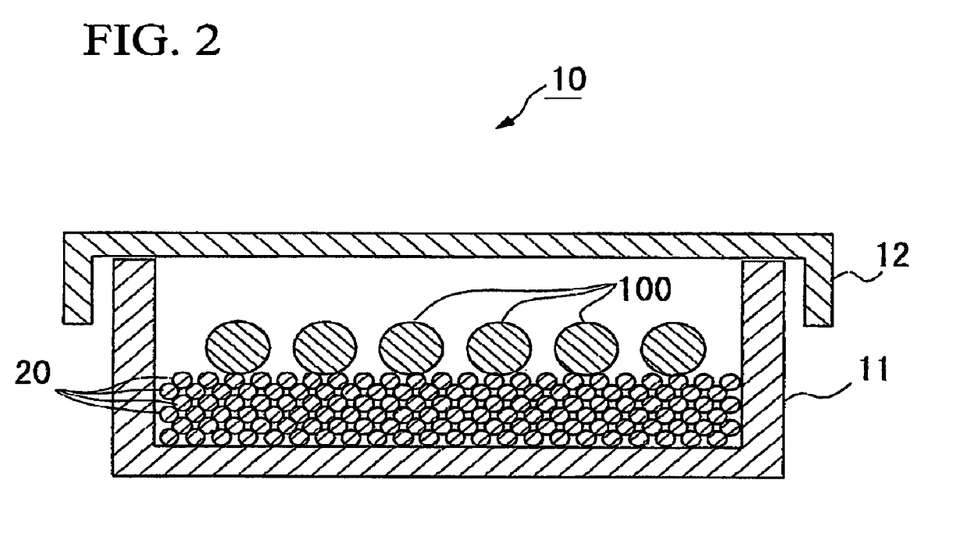
FIG. 2 is a cross-sectional view illustrating a structure of container for sintering, in which a support composed of a number of particles is used.

As illustrated in FIG. 2, each of the compacts 100 is supported by the support (inclusion) 20 particles to prevent the compacts 100 from directly coming into contact with, and moving in, the container body 11.

The support 20 is made of an oxide stable with, or unreactive with, the compacts 100 during the sintering step. The preferable support material is Nb, or $SmFe_2$, which is the same as that for the compacts 100.

A number of particles as the support 20 are preferably spreaded all over the basal plane of the container body 11. The preferable particle size for the support 20 is 0.1 to 2.0 mm, more preferably 0.5 to 1.0 mm. When excessively small, they may be caught by sintered body cavities and take extra effort to remove. When excessively large, on the other hand, they may cause deformation of the magnetostrictive element. The support 20 composed of particles are preferably spreaded all over the basal plane of the container body 11 to a thickness of 0.5 to 3.0 mm, for example, because they allow the compacts 100 to be partly embedded therein, as if they were placed on soft sand, to restrict their movement in the container 10.

The compacts 100 are sintered in the container body 11 while being set on the support 20 particles spreaded all over the basal plane of the container body 11. The recommended sintering conditions are 800 to 900° C., preferably 850 to 890° C., and 3 to 48 hours. The recommended sintering atmosphere is non-oxidative, preferably in an inert gas atmosphere, e.g., in an Ar gas, or under vacuum.

The compacts 100 are sintered into a magnetostrictive element.

The magnetostrictive element thus prepared is polycrystalline and represented by the formula $SmFe_2$. It is oriented along the [111] axis, a direction in which it exhibits the highest magnetostriction in a case of an an isotropic magnetostrictive element.

As discussed above, the compacts 100 are sintered in the container for sintering 10 into an magnetostrictive element of $SmFe_2$, while being held by the support 20 of $SmFe_2$ or Nb, which is stable during the sintering step, to prevent fusion-bonding after sintering of the support 20 with the compacts 100 and deterioration of the magnetostrictive characteristics caused by a reaction with a dissimilar material.

The support 20 composed of particles can set the compacts 100 because they are partly embedded in the particles, to restrict their movement. Moreover, each of the compacts 100 is supported by point contact with each support 20 particle, with the result that the support 20 particles can be easily removed from the compact 100 surfaces, even when fusion-bonding occurs between them.

Therefore, the sintering step can be carried out without deteriorating magnetostrictive element characteristics caused by a support 20 material while controlling fusion-bonding between the support 20 and magnetostrictive element by selecting an optimum material for the support 20.

Thus, it can be said that the conditions under which a magnetostrictive element is assuredly and well sintered have been established.

The method for producing a magnetostrictive element is described by the above embodiments of the present invention. However, it is to be understood that the present invention itself is not limited to the embodiments described above, and various variations can be made without departing from the spirit and scope of the present invention.

Figure 3:
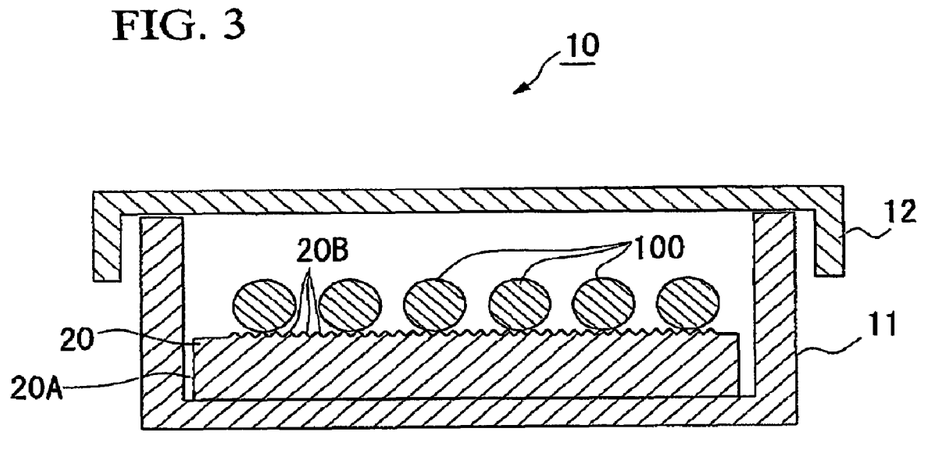
FIG. 3 is a cross-sectional view illustrating a structure of container for sintering, in which a support has a roughened surface.

The support 20 described above is composed of particles. Alternately, it can be in the form of the plate-shaped base board 20A provided with projections 20B protruding upwards from the surface as illustrated in FIG. 3, or having a roughened surface with irregularities, so long as the contact area between the support 20 and compact 100 can be reduced as far as possible. These support 20 structures can support the compacts 100 at multiple points to have a smaller contact area than the conventional simply plate-shaped setter 2 (see FIG. 6). As a result, the support 20 and compact 100 can be separated from each other by a small force, even when fusion-bonding occurs between them.

EXAMPLES

Giant-magnetostrictive materials were prepared by powder metallurgy using a magnetostrictive element material containing Sm and a transition metal element. The results are described below.

First, a sintered body as a magnetostrictive element main body was produced by the following procedure.

First, Sm and Fe as the main phase materials were weighed and molten in an inert Ar gas atmosphere to have a starting alloy having a composition of $SmFe_{1.96}$. The starting alloy was heat-treated by annealing at 890° C. for 12 hours after temperature was stabilized to grow the grains. The obtained alloy powder was preliminarily crushed by a Jaw crusher and Brown mill, and then passed through a sieve (opening size: 2 mm) to remove coarse particles of 2 mm or more.

Sm and Fe as the grain boundary phase materials were weighed and molten in an inert Ar gas atmosphere to have a starting alloy having a composition of $SmFe_{1.77}$. The starting alloy was heat-treated at 150° C. for 6 hours after temperature was stabilized in a hydrogen atmosphere (hydrogen concentration: 80%) to crush the alloy occluded with hydrogen at around 18,000 ppm. The resulting crushed powder had a mean particle size of 5 μm. The crushed powder was passed through a sieve (opening size: 2 mm) to remove coarse particles of 2 mm or more.

Then, the alloy powder thus produced for the starting main phase and grain boundary phase materials were weighed and mixed with each other. The resulting mixture was finely crushed in an Ar gas atmosphere by an atomizer to have an alloy powder having a composition of $SmFe_{1.875}$.

The obtained alloy powder was put in a mold and compacted in a magnetic field of 480 kA/m under a compacting pressure of 800 MPa to have a compact. It was transferred into the mold via a pipe filled with $N_2$ gas. The magnetic field was the so-called transverse one, in which the magnetic field was applied in a direction perpendicular to pressure direction. The compact had a cylindrical shape, 10 mm in diameter and 20 mm long.

The obtained compacts were put in a contained for sintering and heated in a furnace in an Ar gas atmosphere at 890° C. for 6 hours after temperature was stabilized to have a sintered body (magnetostrictive element main body).

In the container for sintering, the compacts were set on the setter particles spreaded all over the basal plane of the container to a thickness of 1.0 mm.

The setter materials were $SmFe_2$ (Example 1), Nb (Example 2), Ta (Comparative Example 1), Fe (Comparative Example 2), Co (Comparative Example 3), Ni (Comparative Example 4), Mo (Comparative Example 5), $Dy_2O_3$ (Comparative Example 6) and $Sm_2O_3$ (Comparative Example 7).

Each of these sintered bodies were observed for fusion-bonding between it and the setter. It was found that the setters of Ta (Comparative Example 1), Fe (Comparative Example 2), Co (Comparative Example 3), Ni (Comparative Example 4), Mo (Comparative Example 5) were strongly fusion-bonded with the compact (sintered body) of $SmFe_2$. By contrast, fusion-bonding did occur with the setters of $SmFe_2$ (Example 1) and Nb (Example 2), but only weakly, and the fusion-bonded portion could be easily removed by a brush of gold. It is therefore confirmed that $SmFe_2$ and Nb are preferable materials for the setter, where as Ta, Fe, Co, Ni and Mo, used in Comparative Examples 1 to 5, respectively, are not preferable, viewed from prevention of fusion-bonding.

Photographic analysis was also made to observe structures of the sintered bodies prepared in Examples 1 and 2, and Comparative Examples 5 and 6.

Figure 4A:
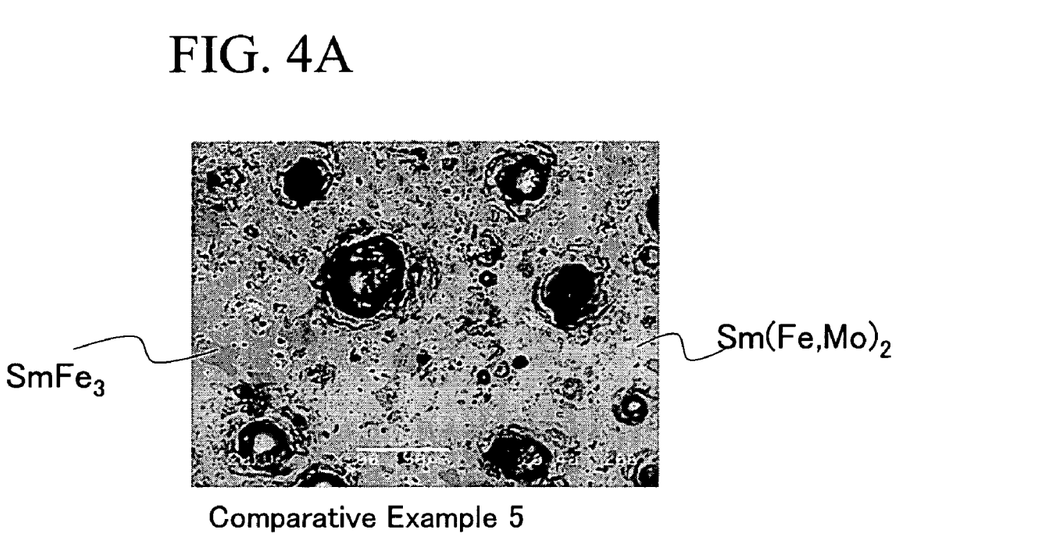
FIG. 4A illustrates a sintered body prepared with a support of Mo particles.

It was confirmed in the sintered body prepared in Comparative Example 5 which used the setter of Mo, Mo penetrated into the Fe site, as shown in FIG. 4A.

Figure 4B:
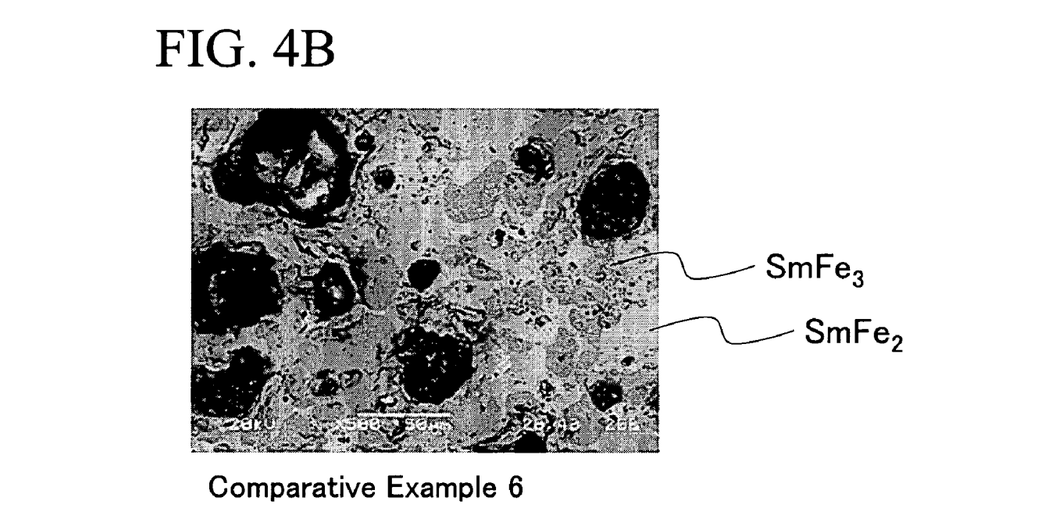
FIG. 4B illustrates a sintered body prepared with a support of Dy$_2$O$_3$ particles.
Figure 5A:
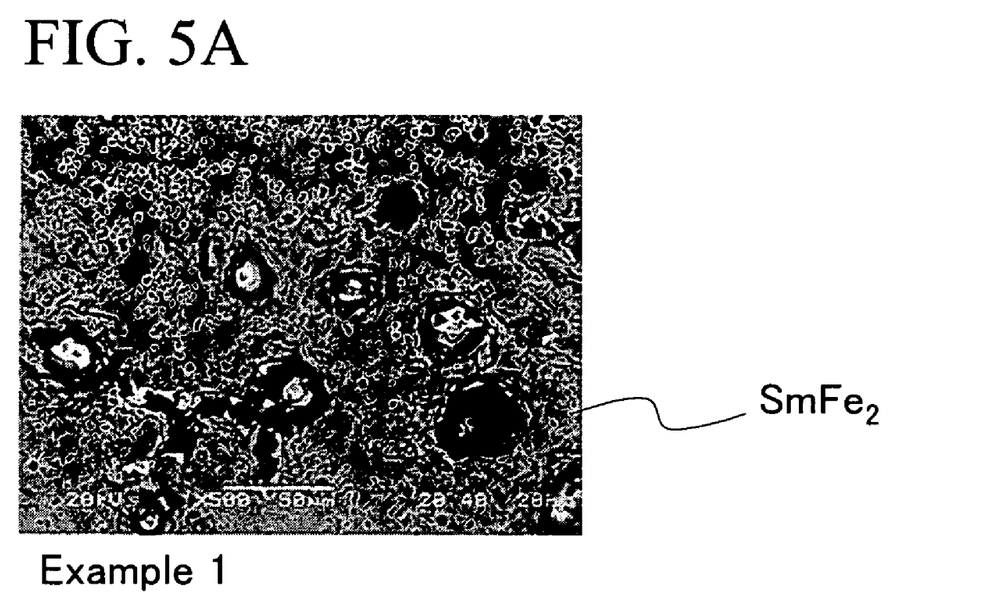
FIG. 5A illustrates a sintered body prepared with a support of SmFe$_2$ particles.
Figure 5B:
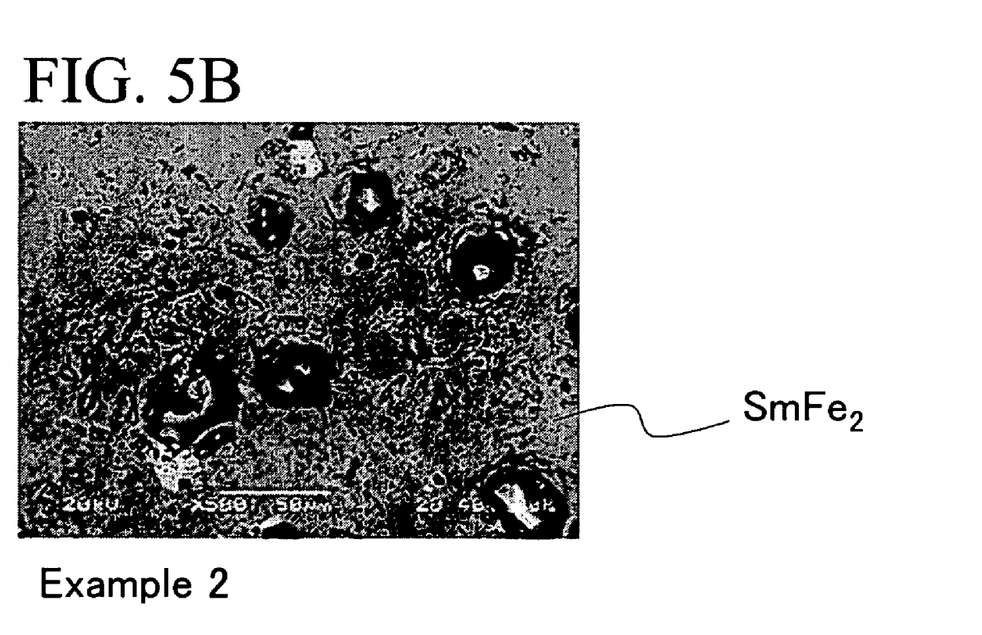
FIG. 5B illustrates a sintered body prepared with a support of Nb particles.

It was also confirmed in the sintered bodies prepared in Comparative Example 6 which used the setter of $Dy_2O_3$, $SmFe_2$ was oxidized into $SmFe_3$, as shown in FIG. 4B.

It was also confirmed in the sintered body prepared in Comparative Example 7 which used the setter of $Sm_2O_3$, $SmFe_2$ was similarly oxidized into $SmFe_3$.

By contrast, the sintered bodies prepared in Examples 1 and 2, which used $SmFe_2$ and Nb for the respective setter, had a number of $SmFe_2$ particles distributed in the structure, although it was rare-earth rich, by which it was confirmed that oxidation was controlled to a limited extent.

Each of the sintered bodies prepared in Comparative Examples 6 and 7, and Examples 1 and 2 was measured for sintered body density and magnetostrictive characteristic (magnetostrictive value). The magnetostrictive value was determined by measuring the elongation of the sintered bodies using a strain gauge, where a magnetic field used for measurement was applied in the direction in parallel to, and also perpendicular to the direction of the magnetic field applied during the compacting. The magnetic field used for measurement was 31.6 kA/m (0.4 kOe).

The results are given in Table 1.

TABLE 1

| | | Sintered body | Magnetostrictive value | |
|---|---|---|---|---|
| | Setter material | density Dt (%) | Parallel direction | Perpendicular direction |
| Comparative Example 6 | $Dy_2O_3$ | 92.1 | −90 | −20 |
| Comparative Example 7 | $Sm_2O_3$ | 97.1 | −20 | −20 |
| Example 1 | $SmFe_2$ | 97.3 | −770 | −300 |
| Example 2 | Nb | 97.2 | −700 | −330 |

As shown in Table 1, each of the sintered bodies prepared in Comparative Example 7 and Examples 1 and 2, which used $Sm_2O_3$, $SmFe_2$ and Nb, respectively, has a high density of 97% or more.

It is also confirmed that the sintered bodies prepared in Examples 1 and 2, which used $SmFe_2$ and Nb, respectively, has a notably high magnetostrictive value.

Therefore, the sintered body is high both in density and magnetostrictive value, when prepared with a setter of $SmFe_2$ or Nb.

It is thus confirmed that use of a setter of $SmFe_2$ or Nb can give a sintered body of excellent characteristics, because it prevents fusion-bonding between the sintered body and setter and controls oxidation during the sintering step.

What is claimed is:

1. A method for producing a magnetostrictive element having a composition of $SmFe_2$, comprising the steps of:
   compacting a starting powder containing at least Sm and Fe into a compact in a magnetic field, and
   sintering the compact while being supported by a support of Nb and/or $SmFe_2$ in a container.

2. The method for producing a magnetostrictive element according to claim 1, wherein the support is composed of Nb.

3. The method for producing a magnetostrictive element according to claim 1, wherein the support is composed of $SmFe_2$.

4. The method for producing a magnetostrictive element according to claim 1, wherein the support comes into contact with the compact at multiple points.

5. The method for producing a magnetostrictive element according to claim 4, wherein the compacts is placed on Nb and/or $SmFe_2$ particles in the container during the sintering step.

6. The method for producing a magnetostrictive element according to claim 5, wherein the compact is held at a fixed position by the particles.

7. The method for producing a magnetostrictive element according to claim 5, wherein the compact is held while it is partly embedded in the support composed of the particles.

8. The method for producing a magnetostrictive element according to claim 4, wherein the support is a plate-shaped base board of Nb and/or $SmFe_2$, and is provided with a number of projections on its surface.

* * * * *